United States Patent
Gerstenberger et al.

(10) Patent No.: US 6,832,024 B2
(45) Date of Patent: Dec. 14, 2004

(54) METHOD AND APPARATUS FOR FIBER BRAGG GRATING PRODUCTION

(76) Inventors: David C. Gerstenberger, 13023 NE. 182$^{nd}$ Pl. #B, Bothell, WA (US) 98011; Mark S. Bowers, 19609 9$^{th}$ Dr. SE., Bothell, WA (US) 98011; Dennis D. Lowenthal, 1007 Bell St., Edmonds, WA (US) 98020; Jason N. Farmer, 5408 NE. 88$^{th}$ St., Bldg. E, Vancouver, WA (US) 98665; Roy D. Mead, 752 Walnut St., Edmonds, WA (US) 98020; Charles I. Miyake, 6416 106$^{th}$ Ave., NE., Kirkland, WA (US) 98033

( * ) Notice: Subject to any disclaimer, the term of this patent is extended or adjusted under 35 U.S.C. 154(b) by 95 days.

(21) Appl. No.: 10/042,943

(22) Filed: Nov. 19, 2001

(65) Prior Publication Data

US 2003/0048523 A1 Mar. 13, 2003

Related U.S. Application Data

(60) Provisional application No. 60/276,651, filed on Mar. 16, 2001, provisional application No. 60/269,152, filed on Feb. 15, 2001, provisional application No. 60/269,150, filed on Feb. 15, 2001, and provisional application No. 60/249,989, filed on Nov. 20, 2000.

(51) Int. Cl.$^7$ ............................ G02B 6/34; G02F 1/37; H01S 3/109
(52) U.S. Cl. ..................... 385/37; 359/328; 372/22
(58) Field of Search ................................ 359/326–332; 385/10, 37; 372/21–22

(56) References Cited

U.S. PATENT DOCUMENTS

| | | | | |
|---|---|---|---|---|
| 5,621,497 A | * | 4/1997 | Terasawa et al. | 355/53 |
| 6,483,965 B1 | * | 11/2002 | Napier et al. | 385/37 |
| 6,701,044 B2 | * | 3/2004 | Arbore et al. | 385/37 |
| 2002/0081068 A1 | * | 6/2002 | Matsumoto et al. | 385/37 |
| 2002/0176647 A1 | * | 11/2002 | Spirin et al. | 385/12 |
| 2003/0031411 A1 | * | 2/2003 | Arbore et al. | 385/37 |

* cited by examiner

Primary Examiner—John D. Lee
(74) Attorney, Agent, or Firm—Patent Law Office of David G. Beck

(57) ABSTRACT

A wide variety of Fiber Bragg writing devices comprising solid state lasers are provided. The solid state lasers emit moderate peak-power output beams which are suitable for efficient production of fiber Bragg gratings without causing embrittlement of the optical waveguide. These solid state lasers generate fourth harmonic output beams with wavelengths of approximately 240 nm, in order to match the primary absorption peak in the ultraviolet range for a typical optical waveguide. Some of these solid state lasers comprise a fequency-doubling crystal and a CLBO crystal used in a non-critically phase-matched orientation as a frequency-quadrupling crystal. In such lasers, both the frequency-doubling crystal and frequency-quadrupling crystal are preferably engineered to minimize or eliminate beam "walkoff."

56 Claims, 8 Drawing Sheets

METHOD AND APPARATUS FOR FIBER BRAGG GRATING PRODUCTION

CROSS-REFERENCES TO RELATED APPLICATIONS

This application claims priority based on the following U.S. Provisional Patent Applications, the disclosures of which are incorporated herein by reference for all purposes: 60/249,989, filed Nov. 20, 2000; 60/269,150, filed Feb. 15, 2001; 60/269,152, filed Feb. 15, 2001; and 60/276,651, filed Mar. 16, 2001. This application also claims priority based on the following U.S. Non-Provisional Patent Applications, the disclosures of which are incorporated herein by reference for all purposes: Method and Apparatus for Fiber Bragg Grating Production, filed Oct. 29, 2001, Ser. No. 10/040,286; and Method and Apparatus for Fiber Bragg Grating Production, filed Oct. 29, 2001, Ser. No. 10/039,099.

FIELD OF THE INVENTION

The invention relates generally to the field of optical waveguide manufacturing and particularly to the processing of optical fibers to create fiber Bragg gratings.

BACKGROUND OF THE INVENTION

Fiber Bragg gratings (FBG's) are portions of optical waveguides, such as optical fibers, which have been processed to reflect and transmit specific wavelengths. The waveguides are typically germanium-doped silica fibers and for the purposes of this description will be referred to as "fibers" or "optical fibers." However, it should be understood that these terms are being used in a generic sense to mean any type of optical waveguide.

Producing FBG's involves exposing the fiber to ultraviolet light, the intensity of which varies between light and dark along the length of the fiber. The light and dark bands of exposure are placed along the fiber with spacing comparable to the wavelength of light to be reflected by the fiber in operation. The ultraviolet light induces changes in the index of refraction of the fiber, producing an index grating along the length of the fiber.

A light source used for exposure of a fiber to make FBG's must provide light within specific ranges of wavelengths in the ultraviolet portion of the spectrum. A typical fiber's primary wavelength range for absorption peaks near 240 nm, and wavelengths differing from the peak by more than about 10 nm are significantly less effective. Even at the peak wavelength, only a small fraction of the laser power is absorbed, so it is highly desirable for the light source to provide light at a wavelength near the absorption peak.

Unfortunately, the current sources of ultraviolet light used for FBG production have various drawbacks. Most current production systems for FBG's use either KrF excimer lasers emitting at 248 nm, or frequency-doubled argon-ion lasers at 244 nm, to expose the fibers. KrF excimer lasers can produce high average powers, which facilitates processing, but they have serious disadvantages. They require toxic, corrosive gases for operation, have high operating and maintenance costs, and produce short duration (~50 ns), low repetition rate (<1000 Hz), high peak output power (~1 MW) ultraviolet pulses. The high peak output powers cause damage to the fibers, weakening them and making them susceptible to fracture. The alternative continuous wave ("cw") argon ion lasers suffer high operating costs and produce weak output powers of one-half watt or less, leading to poor production throughput.

Several other types of lasers, including argon-fluoride and xenon-chloride excimer lasers and flashlamp-pumped lasers, have also been applied to FBG production. However, the argon-fluoride and xenon-chloride excimer lasers suffer from disadvantages similar to those of KrF excimer lasers. Flashlamp-pumped lasers provide some operational improvements compared to excimer lasers, but also generate high peak power pulses which damage the optical fibers.

Other lasers have also been used in laboratory demonstrations of FBG production. Frequency-doubled copper vapor lasers at 255 nm have been used, though their output wavelength is slightly too long to be optimal. Frequency-doubled liquid dye lasers have been tuned to the 240 nm region for FBG fabrication, but such lasers are impractical for large-scale industrial production, since they require very frequent changes of the liquid dye solution to maintain operation.

Solid-state lasers are being increasingly utilized for materials processing applications, due to their reliability and reasonable operating costs. Solid state lasers would be of great interest for FBG production, but heretofore have not been usable because they have not been able to produce the required wavelengths.

SUMMARY OF THE INVENTION

According to one embodiment of the present invention, an apparatus for producing a diffraction pattern in an optical fiber includes a solid state laser for producing a fourth harmonic laser beam having a wavelength in the range of approximately 230 to 250 nanometers and means for using the fourth harmonic laser beam to produce a diffraction pattern on an optical fiber.

In one embodiment, the output beam from one of the foregoing embodiments is used to illuminate a proximity mask which causes a diffraction pattern to be imaged onto the fiber. In an alternative embodiment, a diffraction pattern from a phase mask is imaged onto a waveguide, such that a portion of the FBG may have a different period than that of the corresponding groove of the phase mask.

In another embodiment, a holographic technique is employed: a beam splitter splits the output beam into two beams and interference between these two beams is used to create the FBG.

In still another embodiment, the output beam illuminates a phase mask interferometer which produces the FBG. According to several embodiments, the phase mask interferometer has mirrors for reflecting rays diffracted from the phase mask. According to one such embodiment, an actuator controls the lateral movement of at least one mirror. According to one embodiment, the distance between a first mirror and a direct ray is less than the distance between a second mirror and the direct ray. According to another embodiment, one or more mirrors may be rotated by an actuator. In some embodiments, the fiber is kept parallel to grating during FBG production, but in other embodiments the fiber is inclined with respect to the fiber. Moreover, the output beam may illuminate a single portion of the phase mask or may be scanned along the phase mask.

According to yet another embodiment, any of the previously described light sources illuminates a Lloyd mirror interferometer for producing FBG's.

According to other embodiments, a prism interferometer illuminated by any of the previously described light sources produces FBG's. According to one such embodiment, the prism interferometer includes a right angle prism. According to another such embodiment, an actuator rotates a prism to tune the Bragg wavelength of an FBG.

DESCRIPTION OF THE SPECIFIC EMBODIMENTS

A. Fabrication of Bragg Gratings

There are two basic methods of generating the necessary alternating light and dark regions of an FBG, with many variations of each method. The first is a "holographic" method, wherein two ultraviolet beams are caused to interfere with one another. The resulting interference pattern is projected onto the germanium-doped portion of the fiber. The second basic method is noninterferometric and involves exposure of the fiber to periodic ultraviolet ("IV") radiation.

1. Holographic Methods

Figure 1:
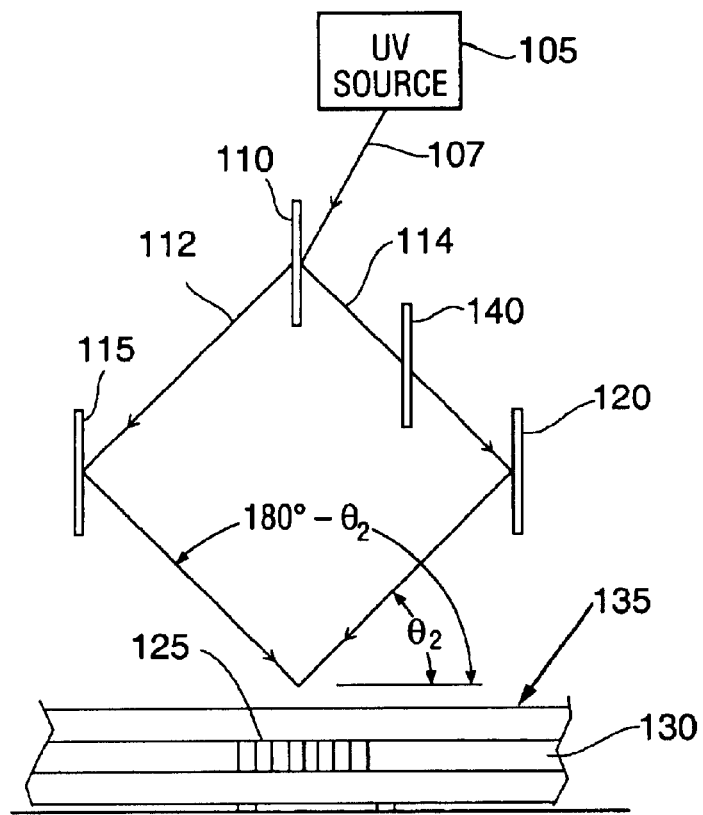
FIG. 1 is a schematic depiction of an FBG writing system which uses optics to produce an interference pattern on an optical fiber.

A basic holographic method is shown schematically in FIG. 1. There, ultraviolet source 105 (typically some form of laser) generates beam 107, which is split into beams 112 and 114 by beam splitter 110. For low-coherence sources, it is advantageous to equalize the path lengths of beams 112 and 114. In FIG. 1, these path lengths are equalized by disposing compensating plate 140 in the path of beam 114. Beams 112 and 114 reflect from mirrors 115 and 120, respectively, and are thereby directed to create interference pattern 125 in doped portion 130 of optical fiber 135. This method is described, for example, in U.S. Pat. No. 4,725,110 (see, for example, col. 1, line 56 through col. 2, line 68 and the referenced figures), the teachings of which are hereby incorporated by reference.

2. Proximity and Projection Masking Techniques

As noted above, the second basic method is noninterferometric and involves exposure of the fiber to periodic ultraviolet UV radiation. The periodic UV radiation can be generated, for example, by having the fiber and a pulsed UV source move relative to one another. Alternatively, the periodic UV radiation can be generated using a spatially periodic grating mask (also known as a "phase mask" or "phase grating") that is imaged or photo imprinted onto the fiber. Phase masks are typically made by etching grooves into a UV-transmitting silica plate using an electron beam, or by holographic exposure.

Figure 2:
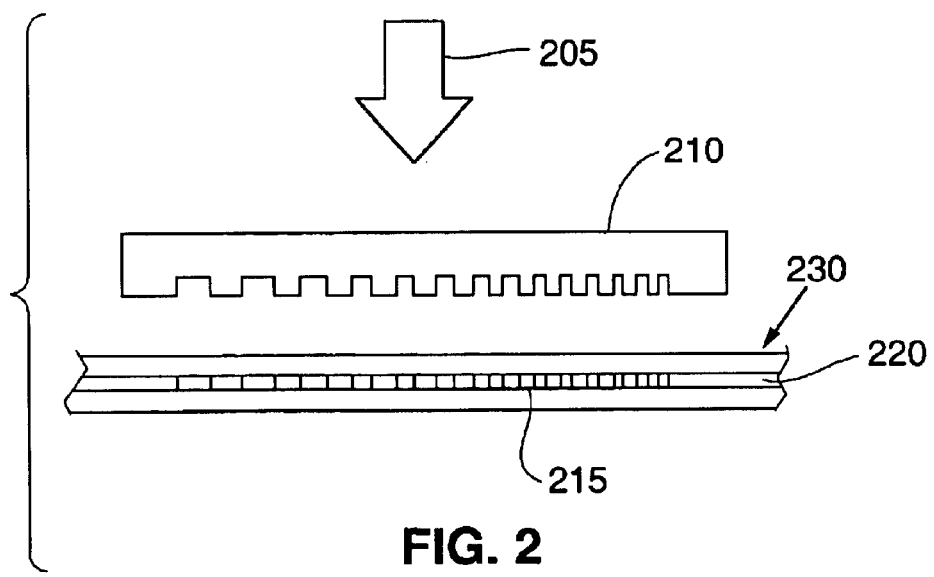
FIG. 2 depicts a method of creating an FBG using a mask.

A method of using a phase mask as a "proximity mask" is schematically shown in FIG. 2. Ultraviolet beam 205 projects an image of mask 210, producing FBG 215 in doped portion 220 of fiber 230. Mask 210 is a "chirped" grating, in which the spacing of the grooves in mask 210 varies from end to end. In another embodiment, mask 210 is not chirped, but instead has grooves with equal widths.

In an alternative embodiment, a projection masking technique may be employed by disposing imaging optics between mask 210 and fiber 230. By using optics which magnify or reduce the spacing of the grooves in mask 210, an FBG may be formed with a period (or range of periods) which is different from that of mask 210.

3. Phase Mask Interferometers

Phase masks are versatile elements and may be used in combination with various devices for producing FBG's. For example, a phase mask may be used in place of beam-splitter 110 in the holographic device shown in FIG. 1.

Figure 3:
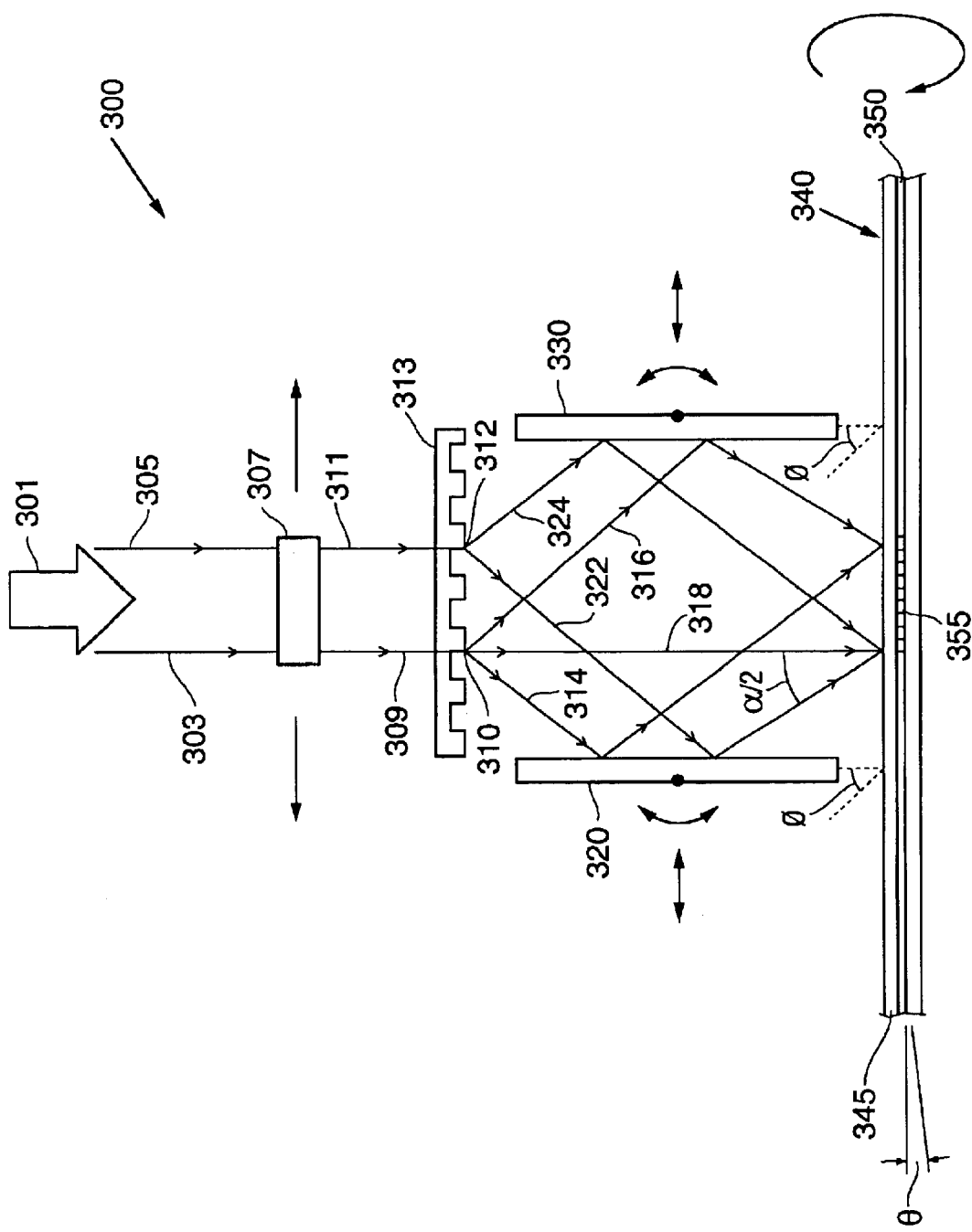
FIG. 3 illustrates a phase mask interferometer.

A phase mask may more advantageously be used in a "phase mask interferometer," in which a phase mask is used both as a beam-splitter and as a wavelength-defining element. FIG. 3 depicts a simplified version of phase mask interferometer 300. UV rays 303 and 305, which are illustrative of a plurality of rays comprising input beam 301, illuminate lens 307. Lens 307 directs rays 309 and 311 to diffraction points 310 and 312, respectively, of mask 313. Mask 313 is preferably a single-phase mask. Rays 314 and 316 are exemplary rays diffracted from diffraction point 310, and rays 322 and 324 are exemplary rays diffracted from diffraction point 312. Rays 314 and 322 are reflected by mirror 320 to fiber 340. Rays 316 and 324 are reflected by mirror 330 to fiber 340. Beams 314 and 316 intersect at doped portion 350 of fiber 340, as do rays 322 and 324, producing portions of FBG 355.

The angle between incident ray 322 and the normal to fiber 340 is known as "half-writing angle" $\alpha/2$. The Bragg wavelength $\lambda_{Bragg}$ may be expressed as a function of the half-writing $\alpha/2$ as follows:

$$\Delta\lambda/\lambda_{Bragg}=-(\Delta\alpha/2)\mathrm{cotangent}(\alpha/2) \qquad \text{Equation (1)}$$

The derivation of Equation (1) is explained in numerous publications and will not be repeated here. (See, e.g., Kayshap, *Fiber Bragg Gratings* (Academic Press 1999) at pp. 58–63.)

Considering Equation (1), it may be seen that phase mask interferometer 300 may be highly tunable if mirrors 320 and 330 can be moved laterally or if the distance between mask 313 and fiber 340 can be altered: either of these adjustments changes the half-writing angle and therefore changes the Bragg wavelength. Therefore, in one preferred embodiment, phase mask interferometer 300 includes an actuator and a controller for adjusting the separation between mask 313 and fiber 340, thereby changing the half-writing angle and tuning the Bragg wavelength. In another preferred embodiment, phase mask interferometer 300 includes an actuator for laterally moving at least one of mirrors 320 and 330, thereby tuning the Bragg wavelength.

It is well known by those skilled in the art that it is often advantageous to enhance the +1 and −1 orders of the interference pattern and to suppress "zero order" energy, such as that from direct ray 318. This is so because even a low-intensity zero order ray can interfere with the +1 and −1 orders, which makes FBG 355 have a period which is the same as that of mask 313. Therefore, in a method according to yet another embodiment, only one of mirrors 320 and 330 is moved laterally. This causes rays 314, 316, 322 and 324 to interfere in a region which is laterally offset from zero order ray 318, which allows FBG 355 to be made without using a zero-order component of input beam 301.

Preferably, mirrors 320 and 330 may be rotated about one or more axes. In one embodiment, mirrors 320 and 330 are rotated such that rays 314, 316, 322 and 324 are reflected out of the plane of FIG. 3, and fiber 340 is positioned where the foregoing rays are directed. Accordingly, direct ray 318 is not incident on fiber 340 and zero-order energy is suppressed.

According to another embodiment, a slanted grating is produced in fiber 355 by positioning fiber 340 at an angle Θ with respect to direct ray 318.

In another preferred embodiment, phase mask interferometer 300 includes means for rotating fiber 340 around its long axis while being exposed to UV radiation.

In yet another preferred embodiment, phase mask interferometer 300 includes actuators for moving input beam 301 and lens 307 laterally along mask 313, as indicated by the arrows adjacent to mask 313 in FIG. 3. This scanning technique allows FBG 355 to be made relatively long. The quality of FBG's produced using a scanning technique depends on the precision with which mask 313 is manufactured.

Figure 4:
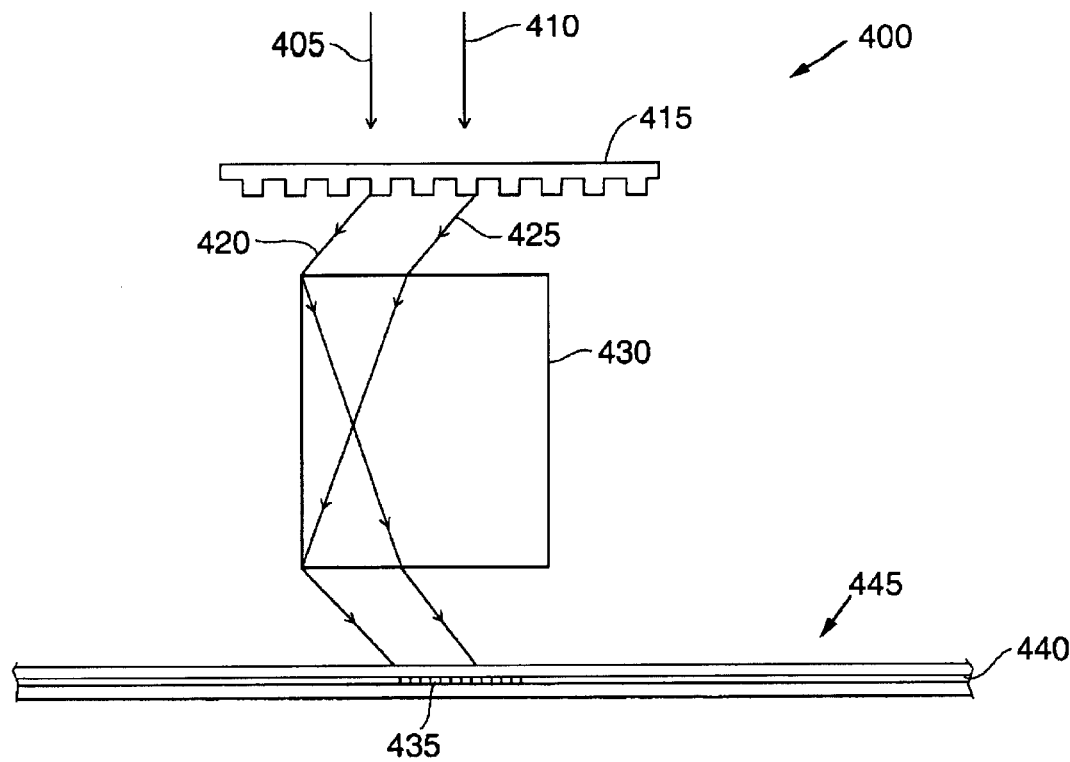
FIG. 4 illustrates a phase mask interferometer in which a block has replaced the mirrors of the interferometer shown in FIG. 3.

In the embodiment illustrated in FIG. 4, UV light rays 405 and 410 are incident upon phase mask 415. Diffracted rays 420 and 425 emitted from phase mask 415 are refracted by block 430 and produce FBG 435 in doped layer 440 of fiber 445. Block 430 replaces mirrors 320 and 330 of the device shown in FIG. 3 and provides stability to phase mask interferometer 400. Block 430 may be made of any convenient material, such as silica.

4. Lloyd Bragg Writer

Figure 5:
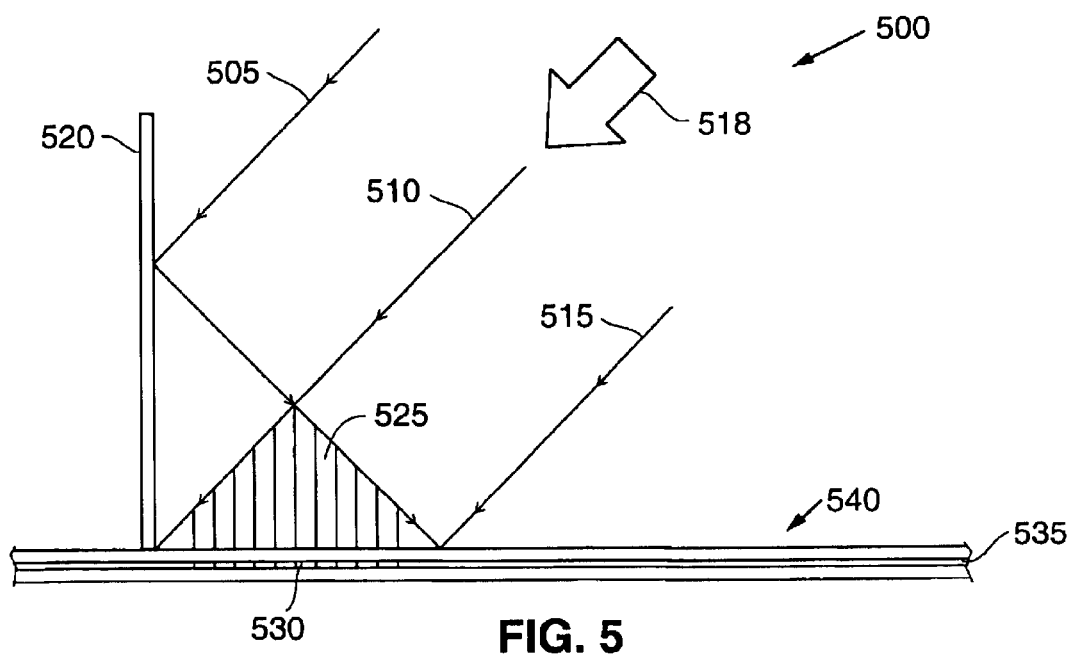
FIG. 5 illustrates a Bragg writer which uses a Lloyd mirror to create the necessary interference pattern.

Instead of splitting an incident beam and recombining the beam using mirrors, FBG's may be produced using a single "Lloyd" mirror, as shown in Lloyd Bragg writer 500 of FIG. 5. Input rays 505, 510 and 515 are parallel to one another and are examples of the many ray paths of input beam 518. Input ray 505 is reflected from mirror 520 and interferes with ray 510. The interference between rays such as 505 and 510 is shown schematically by the vertical lines in zone 525. This interference pattern causes FBG 530 in doped layer 535 of fiber 540.

Input beam 518 should have a coherence length equal to at least the path difference introduced by the "fold" in the beam. Preferably, the intensity profile and coherence properties should be relatively constant across input beam 518. Fiber 540 is preferably oriented perpendicular to mirror 520.

5. Prism Interferometers

Figure 6:
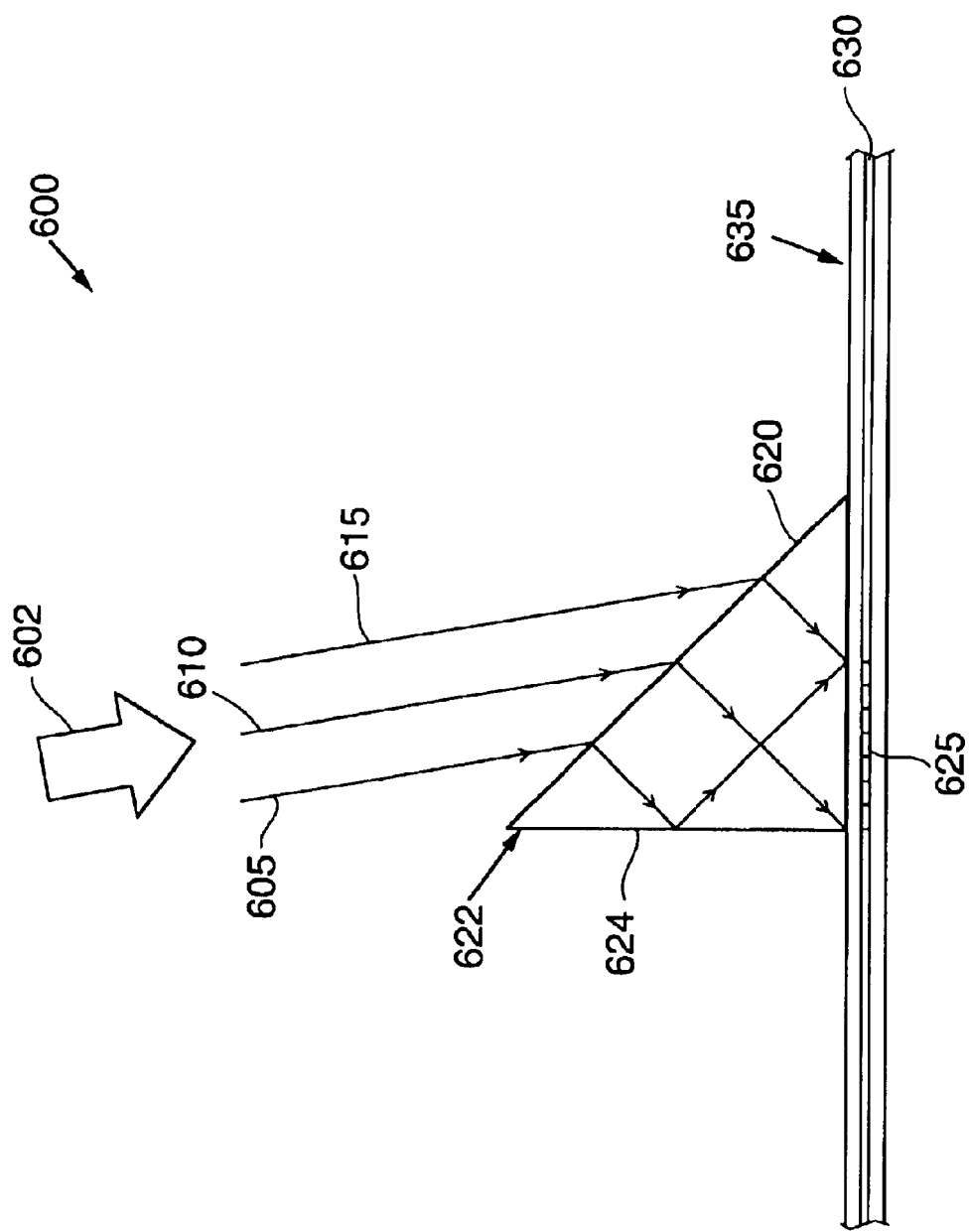
FIG. 6 illustrates a prism interferometer.

A prism interferometer operates in a similar fashion to a Lloyd mirror, except that a prism replaces the mirror. Referring to FIG. 6, selected paths of input beam 602 are shown by representative rays 605, 610 and 615. Ray 605 is refracted by inclined face 620 of prism 622, then reflected by vertical face 624 of prism 622 to interfere with rays 610 and 615, which are only refracted. The resulting interference pattern creates FBG 625 in doped portion 630 of fiber 635.

Prism 622 is preferably a right-angled prism such that input beam 602 is bisected. Prism 622 may be made of any convenient material, but is advantageously made from UV-transmitting silica. Inclined face 620 is advantageously coated by antireflection material. Prism interferometer 600 is intrinsically more stable than Lloyd Bragg writer 500, because the rays of the former device are reflected and diffracted inside prism 622 instead of in air. One embodiment of prism interferometer 600 includes an actuator for rotating prism 622, thereby tuning the Bragg wavelength of FBG 625.

B. Light Sources for FBG Production

1. General Principles

Figure 7:
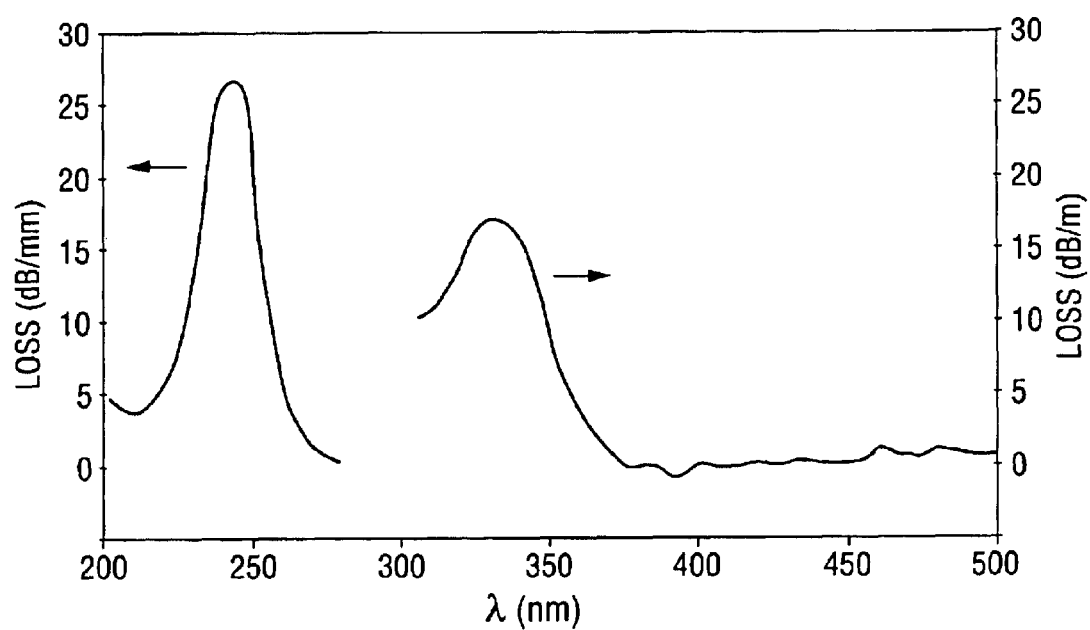
FIG. 7 is a graph of the loss spectrum of a typical germanium-doped silicate fiber.

FIG. 7 is a composite graph which indicates the loss spectrum of a typical telecommunications fiber between 200 and 500 nm. The measured fiber was a single-mode fiber with a composition of 3-mol. % germanium. The data between 200 and 275 nm were obtained using a V-groove splicing technique and are plotted with reference to the scale on the left margin of the graph. The data between 300 and 500 run were obtained by using a standard cutback technique and are plotted with reference to the scale on the right margin of the graph.

The most well-developed diode-pumped lasers available today use Nd or Yb doped into various hosts to provide light having wavelengths of around 1.03–1.07 µm. Such lasers are typically tripled, quadrupled, or quintupled to provide ultraviolet output. Unfortunately, these processes yield output wavelengths well away from the 240 nm required for the most efficient FBG production.

For example, if the fundamental frequency of a 1.03 µm (1030 nm) diode-pumped laser were quadrupled, the resulting wavelength would be 257.5 nm. If the fundamental frequency were quintupled, the resulting wavelength would be 206 run. Referring to FIG. 7, it is apparent that neither of these wavelengths would be suitable for efficient FBG production. If the fundamental frequency of a 1.07 µm (1070 nm) diode-pumped laser were quadrupled, the resulting wavelength would be 267.5 nm. If the fundamental frequency were quintupled, the resulting wavelength would be 214 nm. These wavelengths are even further from 240 nm than the harmonics of the 1.03 µm diode-pumped laser and therefore even less desirable for FBG production.

The following paragraphs describe various devices and methods for producing suitable radiation for the production of FBG's. Any of these light sources may be used with all of the previously-described Bragg writers.

Figure 8:
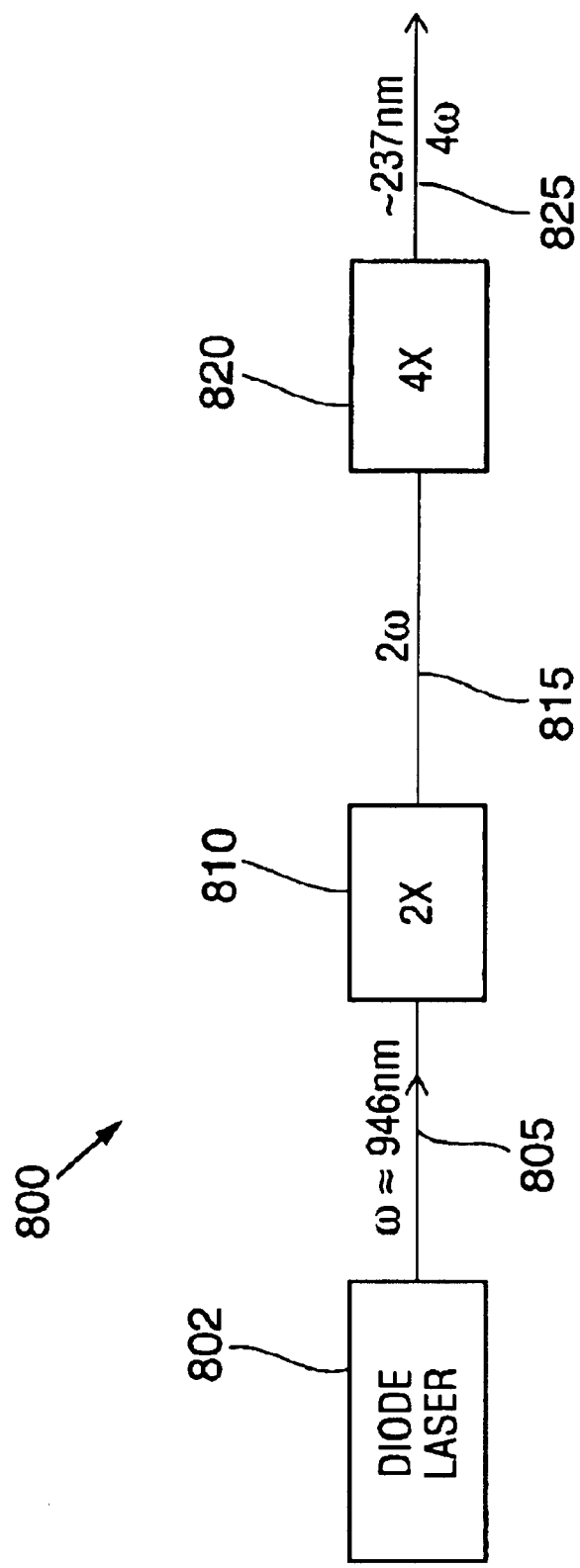
FIG. 8 illustrates an embodiment of the present invention which outputs a fourth harmonic beam.

2. Fourth Harmonic of Lasers With Fundamental Wavelengths in the Range from 940 nm to 980 nm In the example depicted in FIG. 8, diode laser 802 emits beam 805 at approximately 946 nm, which is frequency doubled in doubler crystal 810. Second harmonic beam 815 interacts with quadrupler crystal 820 and is converted to fourth harmonic 825 to provide output in the vicinity of 237 nm.

Diode laser 802 may be any suitable diode laser, including an edge-emitting diode laser (such as an InGaAs diode laser) or a VCSEL that is electrically or optically pumped.

In one embodiment, diode laser 802 comprises an InGaAs diode operating near 960 nm. Since the intensity of the laser diode is low in this embodiment, it is advantageous to resonate beam 805 in a cavity containing doubler crystal 810, then resonate the resulting second harmonic radiation in a cavity containing quadrupler crystal 820.

Doubler crystal 810 and quadrupler crystal 820 may be placed within a cavity which contains diode laser 802 or in one or more external cavities. Doubler crystal 810 and quadrupler crystal 820 are preferably disposed in external cavities so as to increase the conversion efficiency to the second, then the fourth, harmonic.

Doubler crystal 810 may be composed of various materials, including but not limited to lithium triborate ("LBO"), lithium niobate, periodic-poled lithium niobate ("PPLN"), potassium niobate, potassium titanyl phosphate ("KTP"), isomorphs of KTP, such as rubidium titanyl phosphate ("RTP"), cesium titanyl phosphate ("CTP"), potassium titanyl arsenate ("KTA"), rubidium titanyl arsenate ("RTA"), or periodic-poled isomorphs of KTP. Quadrupler crystal 820 may be composed of beta-barium borate ("BBO") or cesium lithium borate ("CLBO"). In one preferred embodiment, quadrupler crystal 820 comprises a CLBO crystal used in a non-critically phase-matched orientation. Both doubler crystal 810 and quadrupler crystal 820 are preferably selected to minimize or eliminate beam "walkoff."

If diode laser 802 comprises a VCSEL, one or more external resonant cavities are advantageously used to produce the second and fourth harmonic beams, as described in U.S. Provisional Application No. 60/269,150 on pages 2 and 3 and FIG. 1. Accordingly, pages 2 and 3 and FIG. 1 of U.S. Provisional Application No. 60/269,150 are hereby incorporated by reference.

Figure 9:
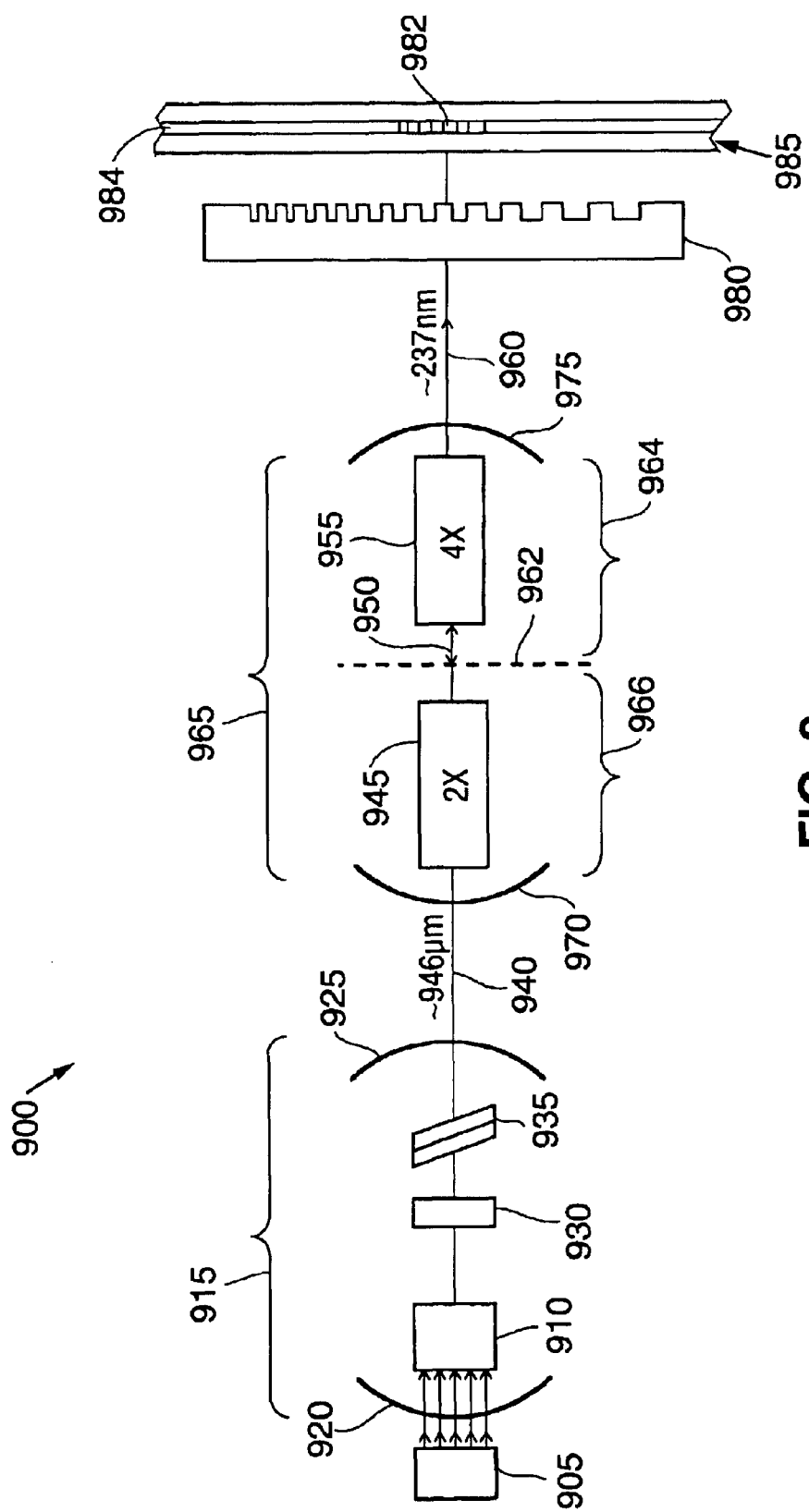
FIG. 9 illustrates an embodiment of the present invention for forming a Bragg grating by using a fourth harmonic beam.

In the apparatus depicted in FIG. 9, pump 905 pumps laser medium 910, which is disposed within cavity 915 formed by mirrors 920 and 925. In this embodiment, Q-switch 930 and tuning element 935 are also disposed within resonator 915. Mirror 925 is partially transmissive for beam 940, which has a wavelength of approximately 946 nm.

Beam 940 is directed to crystal 945, which emits second harmonic beam 950. Crystal 955 converts second harmonic beam 950 to fourth harmonic beam 960 at approximately 237 run. In this embodiment, fourth harmonic beam 960 illuminates proximity mask 980, which produces FBG 982 in doped portion 984 of fiber 985.

In the embodiment shown in FIG. 9, crystals 945 and 955 are disposed within cavity 965, formed by mirrors 970 and 975. In an alternative embodiment, crystals 945 and 955 are disposed within separate cavities: crystal 945 is in cavity 966, formed by mirror 970 and mirror 962, and crystal 955 is in cavity 964, formed by 962 and 975. In other embodiments, crystals 945 and 955 are disposed within cavity 915.

Pump 905 could be any suitable pump, including a flash lamp or a laser. Although pump 905 is depicted end-pumping laser medium 910, in some embodiments pump 905 side-pumps laser medium 910. In some embodiments, pump 905 comprises a diode laser. In one such embodiment, pump 905 comprises an edge-emitting diode laser. In another embodiment, pump 905 comprises a vertical cavity surface emitting diode laser (VCSEL) that is electrically or optically pumped. In some embodiments, pump 905 is a diode bar laser such as an incoherent beam combination ("IBC") diode laser. In one such embodiment, pump 905 is an IBC diode bar laser.

In some embodiments, laser medium 910 is a Yb- or Nd-doped garnet (such as YAG). In one such embodiment, laser medium 910 is an Nd:YAG laser being operated on a transition at 946 nm, or Nd doped into other hosts at similar wavelengths.

In another embodiment, laser medium 910 is an Nd:YAG laser and beam 940 has a wavelength of approximately 946 nm, which is quadrupled to produce fourth harmonic beam 960 at approximately 237 nm. As described in pages 3–8 of U.S. Provisional Application No. 60/276,651, the teachings of which are hereby incorporated by reference, an Nd:YAG laser crystal is advantageously pumped by an IBC diode laser. Preferably, the wavelength spectrum of the IBC diode laser is centered in the range of 802 nm to 812 nm, the wavelength range in which an Nd:YAG laser crystal is most strongly absorptive. Id. at p. 7 and FIG. 4. The IBC diode laser is preferably used to end-pump laser medium 910, as disclosed in U.S. Provisional Application No. 60/276,651.

Q-switch 930 may be operated at any convenient frequency, but is preferably operated at between 5,000 and 50,000 Hz. Proper use of a device such as Q-switch 930 is important for all pulsed-output embodiments of the present invention in order to control the peak power of the output beam, thereby reducing damage to the optical fiber during the production of FBG's. Q-switch 930 typically generates pulse widths in the range of 50–500 nanoseconds (ns), but may generate longer or shorter pulses as needed for the particular application.

Considering a typical pulse width of 100 ns, the following example will illustrate the effect of repetition rate on the peak output power. If the average output power of a solid-state laser is 1 Watt, a 20,000 Hz. repetition rate and the 100 ns pulse width results in a peak power of about 500W. If the average power is 1 W, the pulse width remains 100 ns and Q-switch 93G is set to 5,000 Hz., the peak power is about 2,000 W. Accordingly, by varying the pulse width and the repetition rate, output beams having a wide range of peak power may be generated for a given average output power. Such peak power may be well above 2,000 W or well below 500 W, based on the requirements of the particular application.

If the output beam is used to form fiber Bragg gratings, the exemplary range of peak power compares favorably to the peak power of an excimer laser. A typical 1-Watt excimer laser has a repetition rate of around 400 Hz. and a pulse width of 20 ns, yielding a peak power of about 125,000 W. Using pulses with such high peak power for making fiber Bragg gratings has beer shown to substantially weaken the fibers. Continuous-wave argon ion fiber Bragg writers are reported to cause much less damage to the optical fibers. However, argon ion fiber Bragg writers have high operating costs and produce weak output powers of one-half watt or less, leading to poor production throughput.

In contrast, using the longer pulse widths made possible by solid state fiber Bragg writers of the present invention, peak power can be controlled to cause minimal damage to the optical fibers. However, solid state fiber Bragg writers can yield sufficiently high power in the output beam to allow greater production throughput than argon ion fiber Bragg writers. The combination of low-to-moderate peak power and high repetition rates make the solid state fiber Bragg writers of the present invention superior to both excimer and argon ion fiber Bragg writers.

Although laser 900 is depicted with Q-switch 930, laser 900 can be operated either pulsed or in continuous wave ("cw") mode. Using a cw laser, the frequency doubling and quadrupling steps are preferably done in separate resonant cavities so as to increase conversion efficiency. In one embodiment which is advantageous for operation in cw mode, crystal 945 is in cavity 965, formed by mirror 970 and mirror 962, and crystal 955 is in cavity 964, formed by 962 and 975.

Crystals 945 and 955 may be formed of numerous materials. Suitable materials for crystal 945 include, but are not limited to, lithium triborate ("LBO"), lithium niobate, periodic-poled lithium niobate ("PPLN"), potassium niobate, potassium titanyl phosphate ("KTP"), isomorphs of KTP, such as rubidium titanyl phosphate ("RTP"), cesium titanyl phosphate ("CTP"), potassium titanyl arsenate ("KTA"), rubidium titanyl arsenate ("RTA") and periodic-poled isomorphs of KTP. Crystal 955 may be composed of various materials including, but not limited to, beta-barium borate ("BBO") and cesium lithium borate ("CLBO").

As described in pages 3–8 of U.S. Provisional Application No. 60/269,152, which is hereby incorporated by reference, crystals 945 and 955 are preferably selected to minimize or eliminate beam walkoff. In one preferred embodiment, crystal 955 comprises a CLBO crystal used in a non-critically phase-matched orientation. When used as disclosed in U.S. Provisional Application No. 60/269,152, CLBO is between 2 and 20 times more efficient than prior art "quadrupler" crystals for generating light in the wavelength range from 236 nm to 250 nm. This seems to be primarily due to the ability to avoid walkoff during the conversion from approximately 480 nm to approximately 240 nm.

Figure 10:
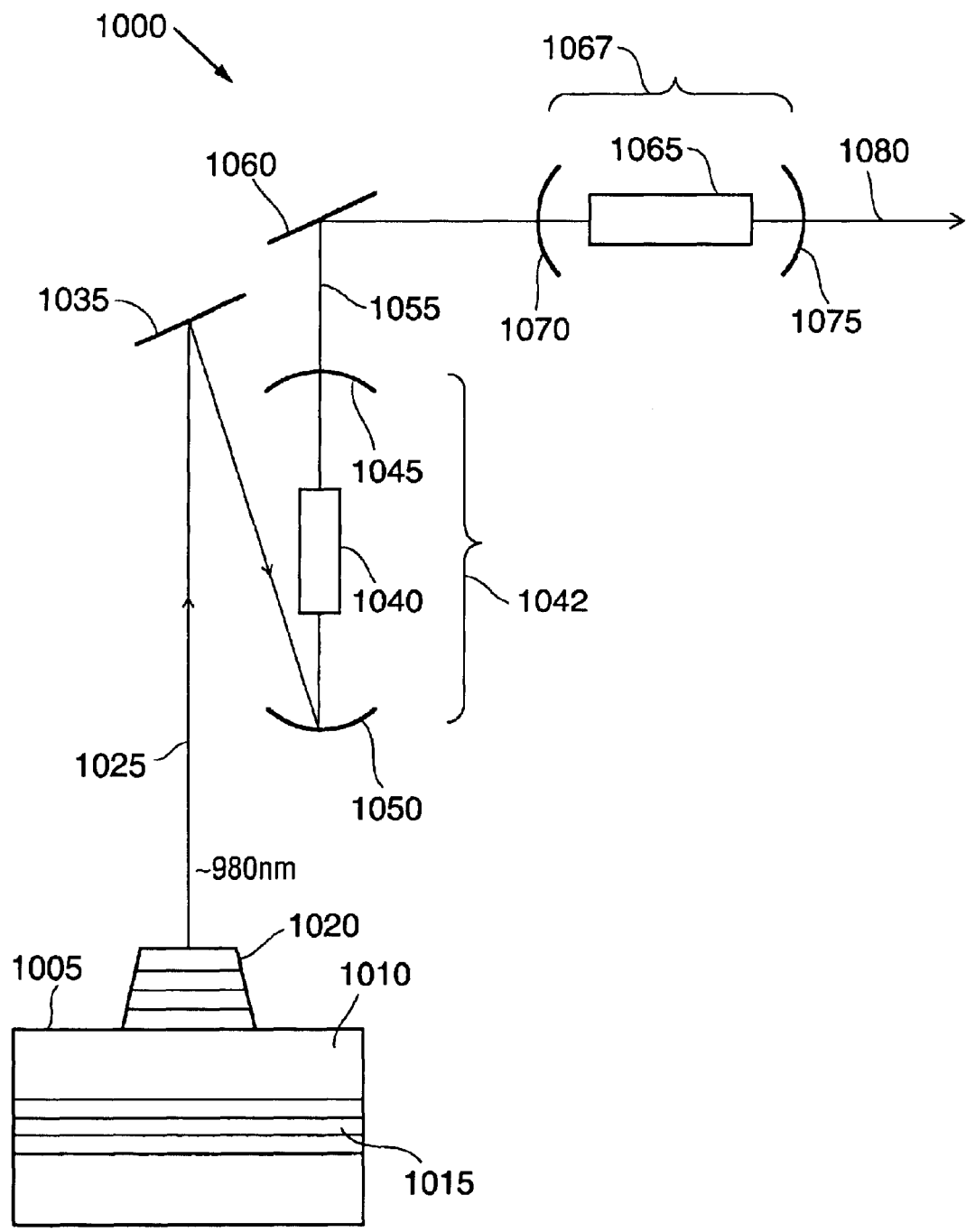
FIG. 10 illustrates an embodiment of the present invention which outputs a fourth harmonic beam.

Another embodiment of the present invention includes laser system 1000 of FIG. 10 to generate a fourth harmonic beam for Bragg writing. VCSEL 1005 (not drawn to scale) includes active layer 1010 between n-doped distributed Bragg reflector mirror 1020 and p-doped distributed Bragg reflector mirror 1020. In the embodiment depicted in FIG. 10, VCSEL 1005 produces beam 1025 having a wavelength of approximately 980 nm. Beam 1025 is reflected by mirror 1035 to doubler crystal 1040, which is disposed within cavity 1042, formed by mirrors 1045 and 1050. Doubler crystal 1040 produces second harmonic beam 1055, which is directed by mirror 1060 to quadrupler crystal 1065, which is positioned within cavity 1067 formed by mirrors 1070 and 1075. Quadrupler crystal 1065 produces fourth harmonic beam 1080 at approximately 240 nm.

In other embodiments, beam 1025 is tuned to other wavelengths in the range from approximately 920 nm to 1 µm.

Doubler crystal 1040 and quadrupler crystal 1065 may be formed of any of the materials discussed above. In one preferred embodiment, quadrupler crystal 1065 comprises a CLBO crystal used in a non-critically phase-matched orientation which minimizes or eliminates beam "walkoff." This embodiment is achievable when beam 1025 has a wavelength near 946 n.

While the best mode for practicing the invention has been described in detail, those of skill in the art will recognize that there are numerous alternative designs, embodiments, modifications and applied examples which are within the scope of the present invention. Accordingly, the scope of this invention is not limited to the previously described embodiments.

We claim:

1. An apparatus for producing a diffraction pattern in an optical fiber, the apparatus comprising:
   solid state laser means for producing a fourth harmonic laser beam having a wavelength in the range of 230 to 250 nanometers; and
   means for using the fourth harmonic laser beam to produce the diffraction pattern on the optical fiber.

2. The apparatus of claim 1, wherein the solid state laser means comprises:
   active laser means; and
   means for pumping the active laser means.

3. The apparatus of claim 1, wherein the solid state laser means comprises:
   means for producing a second harmonic beam from a fundamental beam; and
   means for producing a fourth harmonic beam from the second harmonic beam.

4. The apparatus of claim 1, wherein the solid state laser means operates in continuous wave mode.

5. The apparatus of claim 1, wherein the solid state laser means further comprises a Q-switch.

6. The apparatus of claim 2, wherein the active laser means comprises a crystal doped with a rare earth element.

7. The apparatus of claim 2, wherein the active laser means comprises diode laser means.

8. The apparatus of claim 2, wherein the active laser means comprises a doped garnet crystal.

9. The apparatus of claim 2, wherein the pumping means comprises means for producing an IBC laser beam.

10. The apparatus of claim 3, wherein the second harmonic means comprises means for minimizing beam walkoff.

11. The apparatus of claim 3, wherein the fourth harmonic means is selected to minimize beam walkoff.

12. The apparatus of claim 3, wherein the solid state laser means further comprises:
    first resonator means; and
    active laser means, wherein the active laser means and the second harmonic means are disposed within the first resonator means.

13. The apparatus of claim 3, wherein the solid state laser means further comprises:
    first resonator means;
    second resonator means; and
    active laser means, wherein the active laser means is disposed within the first resonator means and the second harmonic means is disposed within the second resonator means.

14. The apparatus of claim 4, wherein the solid state laser means further comprises:
    first resonator means;
    second resonator means;
    third resonator means;
    active laser means for producing a fundamental beam;
    second harmonic means for producing a second harmonic beam from the fundamental beam; and
    fourth harmonic means for producing a fourth harmonic beam from the second harmonic beam, wherein the active laser means is disposed within the first resonator means, the second harmonic means is disposed within the second resonator means and the fourth harmonic means is disposed within the third resonator means.

15. The apparatus of claim 5, wherein the Q-switch is operated to produce the fourth harmonic beam at a pulse rate in the range of 5,000 to 20,000 Hz.

16. The apparatus of claim 5, wherein the Q-switch is operated to produce the fourth harmonic beam with pulse widths in the range of 50 to 500 nanoseconds.

17. The apparatus of claim 6, wherein the active laser means comprises a mixed garnet.

18. The apparatus of claim 6, wherein the active laser means comprises an Nd:YAG laser operated on a transition at approximately 946 nanometers.

19. The apparatus of claim 6, where the rare earth element is chosen from the list of neodymium and ytterbium.

20. The apparatus of claim 7, wherein the diode laser means comprises a VCSEL which generates a fundamental beam having a wavelength in the range of 920–1000 nanometers.

21. The apparatus of claim 7, wherein the diode laser means comprises an InGaAs diode laser which generates a fundamental beam having a wavelength of 920–1000 nanometers.

22. The apparatus of claim 7, wherein the solid state laser means further comprises:
    first resonator means; and
    doubler means for producing a second harmonic beam from a fundamental beam emitted by the diode laser means, wherein the diode laser means and the doubler means are disposed within the first resonator means.

23. The apparatus of claim 8, wherein pumping means comprises an IBC diode bar laser which emits a pump beam having a wavelength in the range of approximately 802 to 812 nanometers.

24. The apparatus of claim 11, wherein the fourth harmonic means comprises a CLBO crystal.

25. The apparatus of claim 22, wherein the solid state laser means further comprises:

second resonator means; and fourth harmonic means for producing a fourth harmonic beam from the second harmonic beam, wherein the fourth harmonic means is disposed within the second resonator means.

26. The apparatus of claim 24, wherein a wavelength of the solid state laser means is selected such that the CLBO crystal operates in a noncritically phasematched state.

27. An apparatus for producing a diffraction pattern in an optical fiber, the apparatus comprising:
a solid state laser for producing a fourth harmonic laser beam having a wavelength in the range of 230 to 250 nanometers, wherein the solid state laser comprises:
an active laser medium; and
a pump for pumping the active laser medium; and
a Bragg writer for using the fourth harmonic laser beam to produce the diffraction pattern on the optical fiber.

28. The apparatus of claim 27, wherein the solid state laser operates in continuous wave mode.

29. The apparatus of claim 27, wherein the solid state laser further comprises:
a doubler crystal for producing a second harmonic beam from a fundamental beam emitted by the active laser medium; and
a quadrupler crystal for producing a fourth harmonic beam from the second harmonic beam.

30. The apparatus of claim 27, wherein the solid state laser further comprises a Q-switch.

31. The apparatus of claim 27, wherein the active laser medium comprises a crystal doped with a rare earth element.

32. The apparatus of claim 27, wherein the active laser medium comprises a diode laser.

33. The apparatus of claim 27, wherein the active laser medium comprises a doped garnet crystal.

34. The apparatus of claim 27, wherein the pump comprises an IBC diode bar laser.

35. The apparatus of claim 27, wherein the active laser medium comprises a mixed garnet.

36. The apparatus of claim 27, wherein the active laser medium comprises an Nd:YAG laser operated on a transition at approximately 946 nanometers.

37. The apparatus of claim 28, wherein the solid state laser further comprises:
a first resonator;
a second resonator;
a third resonator;
an active laser medium for producing a fundamental beam;
a doubler crystal for producing a second harmonic beam from the fundamental beam; and
a quadrupler crystal for producing a fourth harmonic beam from the second harmonic beam, wherein the active laser medium is disposed within the first resonator, the doubler crystal is disposed within the second resonator and the quadrupler crystal is disposed within the third resonator.

38. The apparatus of claim 29, wherein the doubler crystal is selected to minimize beam walkoff.

39. The apparatus of claim 29, wherein the quadrupler crystal is selected to minimize beam walkoff.

40. The apparatus of claim 29, wherein the quadrupler crystal comprises a CLBO crystal.

41. The apparatus of claim 29, further comprising a first resonator, wherein the active laser medium and the doubler crystal are disposed within the first resonator.

42. The apparatus of claim 29, ftuther comprising:
a first resonator; and
a second resonator, wherein the active laser medium is disposed within the first resonator and the doubler crystal is disposed within the second resonator.

43. The apparatus of claim 30, wherein the Q-switch is operated to produce the fourth harmonic beam at a pulse rate in the range of 5,000 to 20,000 Hz.

44. The apparatus of claim 30, wherein the Q-switch is operated to produce the fourth harmonic beam with pulse widths in the range of 50 to 500 nanoseconds.

45. The apparatus of claim 30, wherein the Q-switch is operated to produce the fourth harmonic beam with peak power in the range of 500 to 2000 watts.

46. The apparatus of claim 31, where the rare earth element is chosen from the list of neodymium and ytterbium.

47. The apparatus of claim 32, wherein the diode laser comprises a VCSEL which generates a fundamental beam having a wavelength of 920–1000 nanometers.

48. The apparatus of claim 32, wherein the diode laser comprises an InGaAs diode which generates a fundamental beam having a wavelength in the range of 920–1000 nanometers.

49. The apparatus of claim 32, wherein the solid state laser further comprises:
a first resonator; and
a doubler crystal for producing a second harmonic beam from a fundamental beam emitted by the diode laser, wherein the diode laser and the doubler are disposed within the first resonator.

50. The apparatus of claim 33, wherein pumping means comprises an IBC diode bar laser which emits a pump beam having a wavelength in the range of approximately 802 to 812 nanometers.

51. The apparatus of claim 40, wherein the CLBO crystal is noncritically phasematched.

52. The apparatus of claim 49, wherein the solid state laser further comprises:
a second resonator; and
a quadrupler crystal for producing a fourth harmonic beam from the second harmonic beam, wherein the quadrupler crystal is disposed within the second resonator.

53. A method for producing a diffraction pattern in an optical fiber, the method comprising the steps of:
pumping an rare-earth doped crystal with a diode laser to generate a fundamental beam;
producing a second harmonic beam from the fundamental beam;
irradiating a CLBO crystal with the second harmonic beam to produce a fourth harmonic beam having a wavelength in the range of approximately 230 to 250 nanometers, with the wavelength of the fundamental beam chosen such that the CLBO crystal operates noncritically phasematched; and
using the fourth harmonic beam as an input beam to a Bragg writer for producing the diffraction pattern on the optical fiber.

54. The method of claim 53, further comprising the step of producing the fourth harmonic beam at a pulse rate in the range of 5,000 to 20,000 Hz.

55. The method of claim 53, further comprising the step of producing the fourth harmonic beam with pulse widths in the range of 50 to 500 nanoseconds.

56. The method of claim 53, further comprising the step of producing the fourth harmonic beam with peak power in the range of 500 to 2000 watts.

* * * * *